United States Patent
Yu

(10) Patent No.: US 6,399,427 B1
(45) Date of Patent: Jun. 4, 2002

(54) FORMATION OF ULTRA-THIN ACTIVE DEVICE AREA ON SEMICONDUCTOR ON INSULATOR (SOI) SUBSTRATE

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/512,092

(22) Filed: Feb. 24, 2000

(51) Int. Cl.⁷ .............................................. H01L 21/00

(52) U.S. Cl. ....................................... 438/149; 438/151

(58) Field of Search ................................. 438/149–155

(56) References Cited

U.S. PATENT DOCUMENTS

| | | | | |
|---|---|---|---|---|
| 5,801,084 A | * | 9/1998 | Beasom et al. | 438/457 |
| 6,096,582 A | * | 8/2000 | Inoue et al. | 438/149 |
| 6,159,824 A | * | 12/2000 | Henley | 438/455 |

\* cited by examiner

Primary Examiner—Jey Tsai
(74) Attorney, Agent, or Firm—Monica H. Choi

(57) ABSTRACT

For forming a thin active device area on a SOI (semiconductor on insulator) substrate, an insulating structure is formed on the SOI (semiconductor on insulator) substrate. The insulating structure has an exposed surface. A second semiconductor substrate is pressed down onto the exposed surface of the insulating structure, and a downward and lateral force is applied on the second semiconductor substrate against the exposed surface of the insulating structure. The second semiconductor substrate is then removed away from the exposed surface of the insulating structure. The thin active device area is formed of a predetermined thickness of material of the second semiconductor substrate being deposited onto the exposed surface of the insulating structure from the second semiconductor substrate being pressed against the exposed surface of the insulating structure. The insulating structure is surrounded by a semiconductor material on the SOI substrate, and the predetermined thickness of material of the second semiconductor substrate is deposited onto the semiconductor material surrounding the insulating structure from the second semiconductor substrate being pressed against the exposed surface of the insulating structure. The present invention may be used to particular advantage when a field effect transistor is formed in the thin active device area with a drain extension, a source extension, and a channel region under a gate of the field effect transistor being formed in the thin active device area, and when a drain silicide and a source silicide of the field effect transistor is formed in the thicker semiconductor material surrounding the thin active device area.

9 Claims, 3 Drawing Sheets

FORMATION OF ULTRA-THIN ACTIVE DEVICE AREA ON SEMICONDUCTOR ON INSULATOR (SOI) SUBSTRATE

TECHNICAL FIELD

The present invention relates generally to fabrication of integrated circuit devices having scaled-down dimensions, and more particularly, to fabrication of an ultra-thin active device area on a SOI (semiconductor on insulator) substrate with retention of thicker semiconductor material on the SOI (semiconductor on insulator) substrate.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Referring to FIG. 1, a common component of a monolithic IC is a MOSFET (Metal Oxide Semiconductor Field Effect Transistor) 100 which is fabricated with SOI (semiconductor on insulator) technology to avoid having the junction capacitance between the drain and the source of the MOSFET 100 and a semiconductor substrate. In such technology, an insulating box 101 is fabricated on a lower semiconductor substrate 102, and components of the MOSFET 100 are fabricated in a SOI (semiconductor on insulator) substrate 103 disposed above the insulating box 101. The insulating box 101 is comprised of an insulating material such as silicon dioxide when the lower semiconductor substrate 102 is comprised of silicon.

The scaled down MOSFET 100 having submicron or nanometer dimensions includes a drain extension 104 and a source extension 106 formed within the SOI substrate 103. The drain extension 104 and the source extension 106 are shallow junctions to minimize short-channel effects in the MOSFET 100 having submicron or nanometer dimensions, as known to one of ordinary skill in the art of integrated circuit fabrication.

The MOSFET 100 further includes a drain contact region 108 with a drain silicide 110 for providing contact to the drain of the MOSFET 100 and includes a source contact region 112 with a source silicide 114 for providing contact to the source of the MOSFET 100. The drain contact region 108 and the source contact region 112 are fabricated as deeper junctions than the drain extension 104 and the source extension 106 such that a relatively large size of the drain silicide 110 and the source silicide 114 respectively may be fabricated therein to provide low resistance contact to the drain and the source respectively of the MOSFET 100. Thus, referring to FIG. 1, the drain contact region 108 and the source contact region 112 extend down within the SOI substrate 103 to the insulating box 101.

The MOSFET 100 further includes a gate dielectric 116 and a gate structure 118 which may be a polysilicon gate. A gate silicide 120 is formed on the polysilicon gate 118 for providing contact to the polysilicon gate 118. A channel 121 of the MOSFET 100 is formed by the region in the SOI substrate 103 between the drain extension 104 and the source extension 106 under the gate dielectric 116. The MOSFET 100 also includes a spacer 122 disposed on the sidewalls of the polysilicon gate 118 and the gate oxide 116. When the SOI substrate 103 is comprised of silicon, the gate dielectric 116 is typically comprised of silicon dioxide. The spacer 122 may also be comprised of silicon dioxide.

Referring to FIG. 1, as the length dimension of the channel 121 of the MOSFET 100 is scaled down, the depth of the drain extension 104 and the source extension 106 is also scaled down to minimize short-channel effects as known to one of ordinary skill in the art of integrated circuit design, and thus the depth of the SOI substrate 103 is scaled down accordingly. Referring to FIG. 1, the drain contact region 108 and the source contact region 112 extend down within the SOI substrate 103 to the insulating box 101. Thus, as the depth of the SOI substrate 103 is further scaled down, the depth of the drain contact region 108 and the source contact region 112 is also scaled down.

However, a smaller depth of the drain contact region 108 and the source contact region 112 results in a smaller volume of the drain silicide 110 and the source silicide 114 which in turn results in higher series resistance at the drain and the source of the MOSFET 100. Such higher parasitic series resistance degrades the speed performance of the MOSFET 100. However, as the length of the channel region 121 of the MOSFET 100 is further scaled down, a thin active device area is desired for minimizing the short-channel effects within the MOSFET 100, as known to one of ordinary skill in the art of integrated circuit design.

Thus, a thin active device area is desired for fabricating the drain extension, the source extension, and the channel region of a MOSFET while at the same time the drain silicide and the source silicide of the MOSFET should be fabricated in a thicker semiconductor region for minimizing the series resistance at the drain and source of the MOSFET.

SUMMARY OF THE INVENTION

Accordingly, in a general aspect of the present invention, a thin active device area is formed with SOI (semiconductor on insulator) technology such that the drain extension, the source extension, and the channel region of a MOSFET may be fabricated therein while at the same time a thicker semiconductor region is retained such that the drain silicide and the source silicide of the MOSFET may formed therein for fabrication of the MOSFET having scaled down dimensions.

In one embodiment of the present invention, for forming a thin active device area on a SOI (semiconductor on insulator) substrate, an insulating structure is formed on the SOI (semiconductor on insulator) substrate. The insulating structure has an exposed surface. A second semiconductor substrate is pressed down onto the exposed surface of the insulating structure, and a downward force is applied on the second semiconductor substrate against the exposed surface of the insulating structure. The second semiconductor substrate is then removed away from the exposed surface of the insulating structure. The thin active device area is formed of a predetermined thickness of material of the second semiconductor substrate being deposited onto the exposed surface of the insulating structure from the second semiconductor substrate being pressed against the exposed surface of the insulating structure.

The another embodiment of the present invention, the insulating structure is surrounded by a semiconductor material on the SOI substrate, and the predetermined thickness of material of the second semiconductor substrate is deposited onto the semiconductor material surrounding the insulating structure from the second semiconductor substrate being pressed against the exposed surface of the insulating structure.

The present invention may be used to particular advantage when a field effect transistor is formed in the thin active device area with a drain extension, a source extension, and a channel region under a gate of the field effect transistor being formed in the thin active device area. In addition, a drain silicide and a source silicide of the field effect transistor are formed in the thicker semiconductor material surrounding the thin active device area.

In this manner, since the drain extension, the source extension, and the channel region under the gate of the field effect transistor is formed in the thin active device area, short channel effects of the field effect transistor are minimized for the field effect transistor having scaled down dimensions. Furthermore, because a larger volume of the drain silicide and the source silicide may be formed in the thicker semiconductor material surrounding the thin active device area, the parasitic series resistance at the drain and the source of the field effect transistor is minimized such that the speed performance of the field effect transistor is enhanced.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, and 9 refer to elements having similar structure and function.

DETAILED DESCRIPTION

Figure 1:
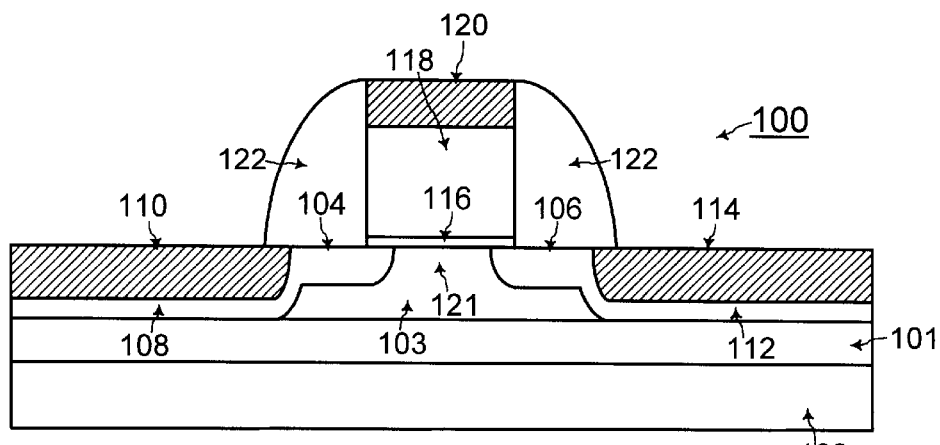
FIG. 1 shows a cross-sectional view of a MOSFET having drain and source extensions and drain and source contact regions formed in SOI (Semiconductor-On-Insulator) technology, as known in the prior art.
Figure 2:
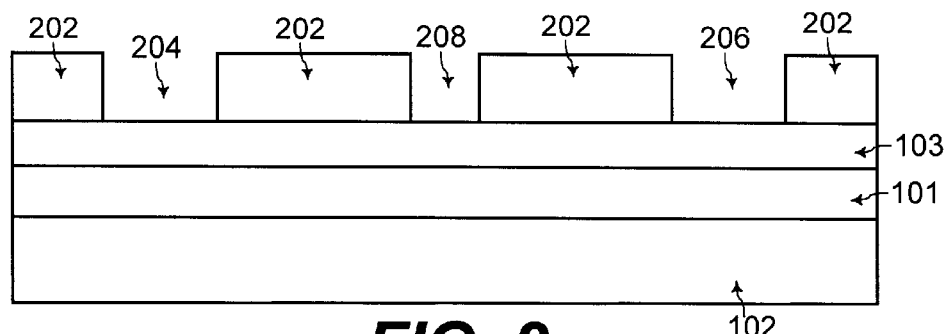
FIGS. 2, 3, 4, 5, 6, 7, 8, and 9 show cross-sectional views of a MOSFET fabricated according to an embodiment of the present invention for illustrating the steps for formation of a thin active device area for fabrication of the drain extension, the source extension, and the channel region of the MOSFET therein for SOI (Semiconductor-On-Insulator) technology.
Figure 3:
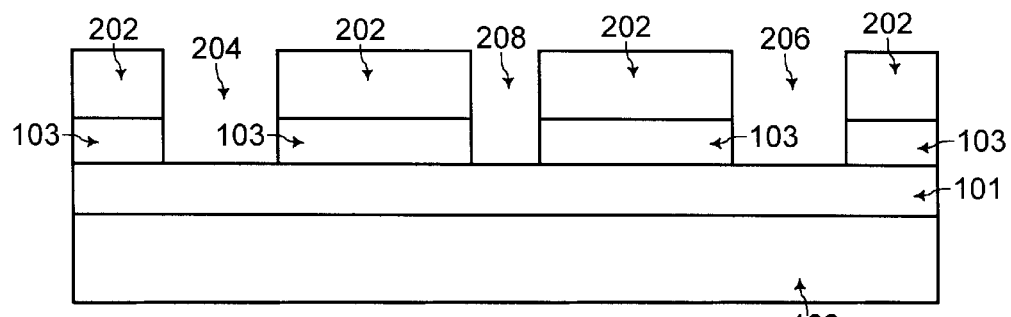

Referring to FIG. 2, in a general aspect of the present invention, for forming a thin active device area in SOI (semiconductor on insulator) technology, a photoresist layer 202 is deposited on the SOI (semiconductor on insulator) substrate 103. The photoresist layer 202 is etched to form a first isolation opening 204, a second isolation opening 206, and an active device area opening 208. Referring to FIG. 3, such openings are also etched through the SOI substrate 103. Processes for depositing and etching through a photoresist layer and a SOI substrate are known to one of ordinary skill in the art of integrated circuit fabrication.

Referring to FIG. 2, the thickness of the isolation box 101 may be in a range of approximately 1500 Å (angstroms) to approximately 2500 Å (angstroms), and the thickness of the SOI substrate 103 may be in a range of approximately 500 Å (angstroms) to approximately 700 Å (angstroms), according to one embodiment of the present invention. The width of the first and second isolation openings 204 and 206 may be in a range of approximately 2000 Å (angstroms) to approximately 4000 Å (angstroms), according to one embodiment of the present invention. The width of the active device area opening 208 may be in a range of approximately 800 Å (angstroms) to approximately 1200 Å (angstroms), according to one embodiment of the present invention.

Figure 4:
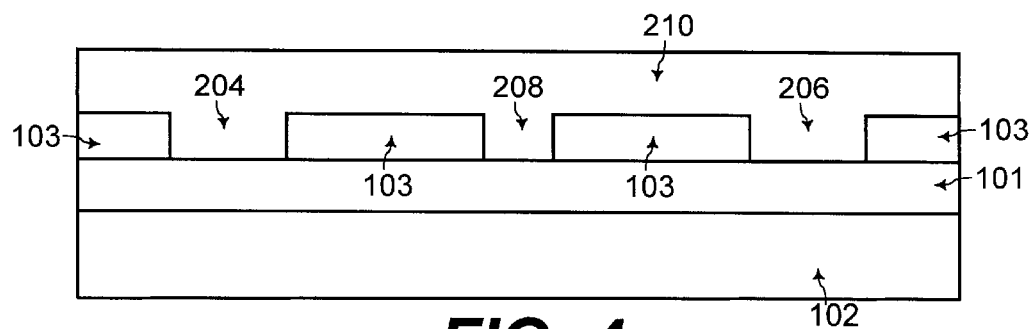

Referring to FIGS. 3 and 4, the photoresist layer 202 is then etched off from the SOI substrate 103. An insulating material 210 is then deposited to fill the first isolation opening 204, the second isolation opening 206, and the active device area opening 208 through the SOI substrate 103. The insulating material 210 may be comprised of silicon dioxide for example, and may have a thickness in a range of approximately 2000 Å (angstroms) to approximately 3000 Å (angstroms), according to one embodiment of the present invention. Processes for depositing such insulating material are known to one of ordinary skill in the art of integrated circuit fabrication.

Figure 5:
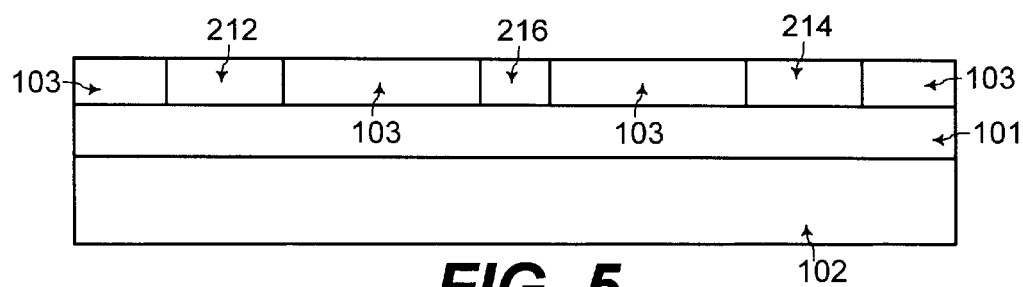

Referring to FIG. 5, the insulating material 210 is polished down until the semiconductor material of the SOI substrate 103 is exposed such that the insulating material 210 is contained within the first isolation opening 204 to form a first isolation structure 212 and within the second isolation opening 206 to form a second isolation structure 214 and within the active device area opening 208 to form an insulating structure 216. Processes for polishing down such insulating material, such as CMP (chemical mechanical polishing) processes are known to one of ordinary skill in the art of integrated circuit fabrication. After such a polish, the thickness of the SOI substrate 103 may be in a range of approximately 300 Å (angstroms) to approximately 500 Å (angstroms), according to one embodiment of the present invention.

Figure 6:
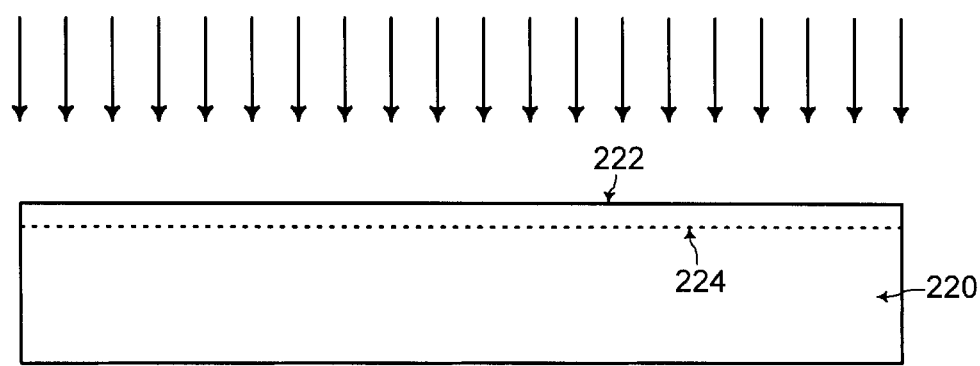

Referring to FIG. 6, a dopant is implanted into a second semiconductor substrate 220. The second semiconductor substrate 220 may be a silicon substrate, and the dopant may be comprised of hydrogen ions. The dopant is implanted into a predetermined face 222 of the semiconductor substrate 220 such that a peak concentration of the dopant is at a predetermined thickness (represented by the dashed line 224) from the predetermined face 222 of the semiconductor substrate 220. The predetermined thickness may be in a range of approximately 50 Å (angstroms) to approximately 100 Å (angstroms), according to one embodiment of the present invention.

Figure 7:
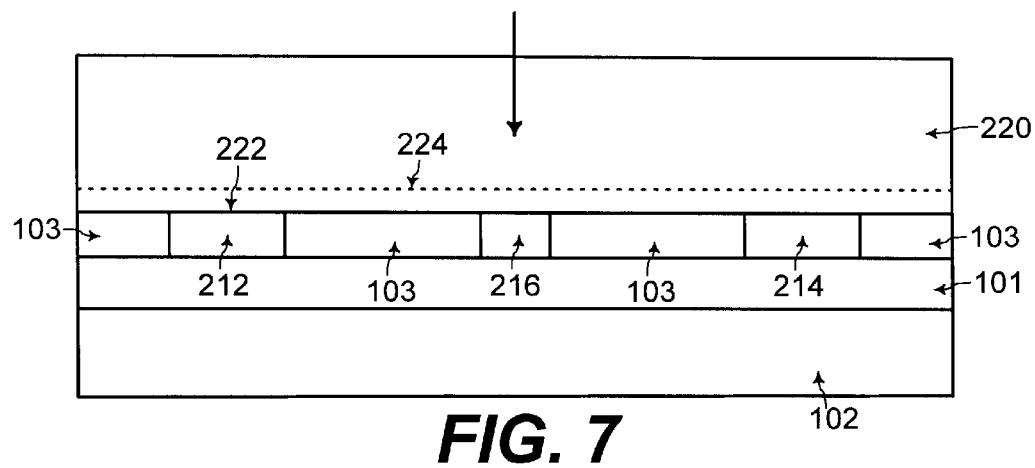
Figure 8:
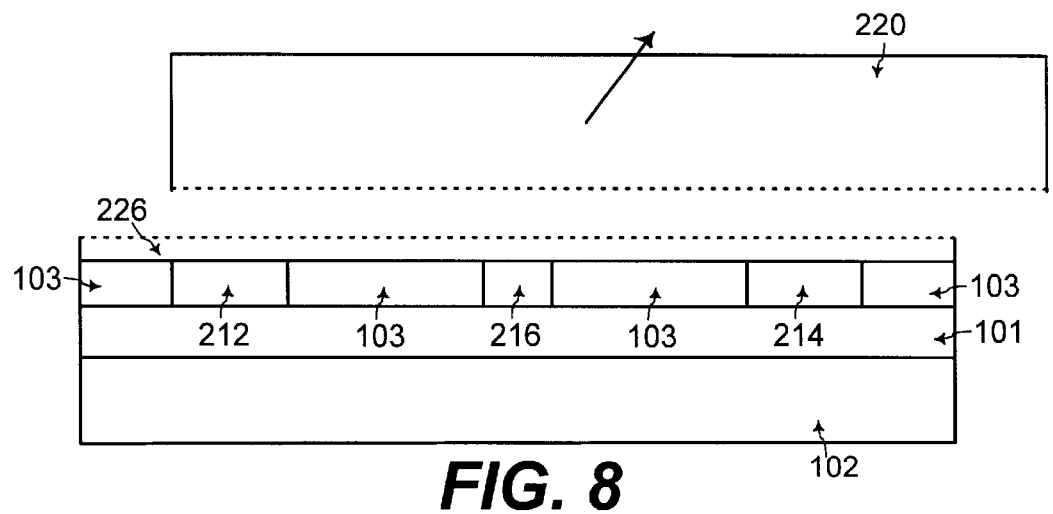

Referring to FIG. 7, the second semiconductor substrate 220 is pressed down with a downward force onto the structures of the SOI substrate 103 including the exposed surface of the insulating structure 216. Referring to FIGS. 7 and 8, the second semiconductor substrate 220 is pressed down and then removed away from the SOI substrate 103 including the exposed surface of the insulating structure 216 with a downward and lateral force. Such a wafer bonding process may be performed at room temperature and in a nitrogen ($N_2$) ambient to prevent oxidation of the SOI substrate 103 and the second semiconductor substrate 220.

Further referring to FIGS. 7 and 8, the peak concentration of the hydrogen ions at the predetermined thickness (represented by the dashed line 224) from the predetermined face 222 of the second semiconductor substrate 220 causes a weakening of the bonds of the semiconductor crystal of the second semiconductor substrate 220. Thus, with the downward and lateral force exerted on the second semiconductor substrate 220, the predetermined thickness 226 of the second semiconductor substrate 220 is deposited onto the structures of the SOI substrate 103 when the second semiconductor substrate 220 is removed away from the SOI substrate 103, as illustrated in FIG. 8.

Figure 9:
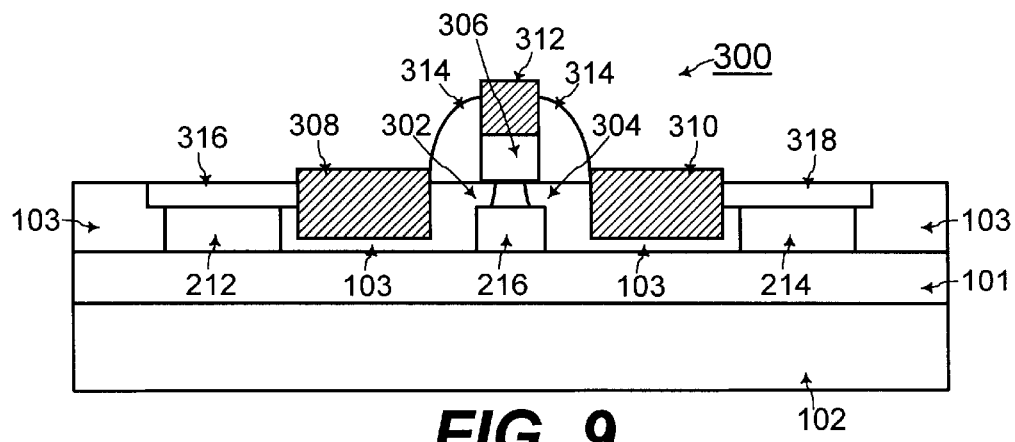

Further referring to FIG. 8, a thin active device area is formed of the predetermined thickness 226 of the second semiconductor substrate 220 deposited onto the exposed surface of the insulating structure 216. Referring to FIGS. 8 and 9, a MOSFET 300 is formed in such an active device area. A drain extension 302 and a source extension 304 of the MOSFET 300 are formed in such an active device area. Furthermore, a gate structure 306 is formed over a channel region of the MOSFET 300 with the channel region of the MOSFET 300 being within the active device area.

Further referring to FIGS. 8 and 9, the thin active device area and the insulating structure 216 are surrounded by the semiconductor material of the SOI substrate 103 with the predetermined thickness 226 of the second semiconductor substrate 220 deposited thereon. A drain silicide 308 and a source suicide 310 are formed in the surrounding semiconductor material of the SOI substrate 103 for providing contact to the drain and source respectively of the MOSFET 300. In addition, a gate silicide 312 is formed on the gate structure 306 for providing contact to the gate of the MOSFET 300. Spacers 314 are formed on the sidewalls of the gate structure of the MOSFET 300. Additional isolation structures 316 and 318 are also formed to surround the MOSFET 300.

In this manner, the drain extension, the source extension, and the channel region of the MOSFET 300 are formed in the active device area having a thickness of only approximately 50 Å (angstroms) to approximately 100 Å (angstroms), according to one embodiment of the present invention, on the insulating structure 216. With such a thin active device area, short channel effects are minimized for the MOSFET 300 having scaled down dimensions of tens of nanometers.

Furthermore, the drain silicide 308 and the source silicide 310 of the MOSFET 300 are formed in the thicker semiconductor material of the SOI substrate 103 surrounding the thin active device area. Thus, the drain silicide 308 and the source silicide 310 may have a higher thickness of approximately 350 Å (angstroms) to approximately 600 Å (angstroms), according to one embodiment of the present invention. Such thicker silicide minimizes the series resistance at the drain and the source of the MOSFET 300 such that the speed performance of the MOSFET 300 is enhanced.

The foregoing is by way of example only and is not intended to be limiting. For example, any specified material or specified dimension of any structure described herein is by way of example only. Furthermore, as will be understood by those skilled in the art, the structures described herein may be made or used in the same way regardless of their position and orientation. Accordingly, it is to be understood that terms and phrases such as "on," "downward," and "lateral," as used herein refer to relative location and orientation of various portions of the structures with respect to one another, and are not intended to suggest that any particular absolute orientation with respect to external objects is necessary or required. The present invention is limited only as defined in the following claims and equivalents thereof.

I claim:

1. A method for forming a field effect transistor with a thin active device area on a SOI (semiconductor on insulator) substrate, the method including the steps of:

A. forming an insulating structure on an insulating box disposed on said SOI (semiconductor on insulator) substrate, said insulating structure having an exposed top surface, and forming a semiconductor material on said insulating box to surround said insulating structure such that said top surface of said insulating structure remains exposed;

B. pressing down a second semiconductor substrate onto said exposed top surface of said insulating structure and onto said semiconductor material surrounding said insulating structure, wherein a downward force is applied on the second semiconductor substrate against said exposed top surface of said insulating structure and against said semiconductor material surrounding said insulating structure;

C. removing said second semiconductor substrate away from said exposed top surface of said insulating structure and away from said semiconductor material surrounding said insulating structure;

wherein said thin active device area is formed of a predetermined thickness of material of said second semiconductor substrate being deposited onto said exposed top surface of said insulating structure from said second semiconductor substrate being pressed against said exposed top surface of said insulating structure in said step B;

and wherein said predetermined thickness of material of said second semiconductor substrate is deposited onto said semiconductor material surrounding said insulating structure from said second semiconductor substrate being pressed against said semiconductor material surrounding said insulating structure in said step B;

D. forming a drain extension, a source extension, and a channel region of said field effect transistor in said thin active device area; and E. forming a drain silicide and a source silicide of said field effect transistor with said semiconductor material surrounding said insulating structure and with said predetermined thickness of material of said second semiconductor substrate deposited onto said semiconductor material surrounding said insulating structure.

2. The method of claim 1, wherein said predetermined thickness of material of said second semiconductor substrate to be deposited onto said exposed top surface of said insulating structure is in a range of approximately 50 Å (angstroms) to approximately 100 Å (angstroms).

3. The method of claim 1, wherein a thickness of said semiconductor material surrounding said insulating structure is in a range of approximately 300 Å (angstroms) to approximately 500 Å (angstroms).

4. The method of claim 1, wherein said drain silicide and said source silicide of said field effect transistor has a thickness in a range of approximately 350 Å (angstroms) to approximately 600 Å (angstroms).

5. The method of claim 1, further including the step of:

implanting a dopant into a predetermined face of said second semiconductor wafer to have a peak concentration at a depth of said predetermined thickness from said predetermined face of said second semiconductor wafer; and pressing said predetermined face of said second semiconductor wafer against said exposed surface of said insulating structure in said step B;

wherein said peak concentration of said dopant at said predetermined thickness from said predetermined face of said second semiconductor wafer causes said predetermined thickness of material of said second semiconductor substrate to be deposited onto said exposed surface of said insulating structure.

6. The method of claim 5, wherein said second semiconductor substrate is comprised of silicon, and wherein said dopant is comprised of hydrogen ions.

7. The method of claim 1, wherein said predetermined thickness of material of said second semiconductor substrate to be deposited onto said exposed surface of said insulating structure is in a range of approximately 50 Å (angstroms) to approximately 100 Å (angstroms).

8. The method of claim 1, wherein said insulating structure is comprised of silicon dioxide, and wherein said second semiconductor substrate is comprised of silicon.

9. A method for forming a field effect transistor with a thin active device area on a SOI (semiconductor on insulator) substrate, the method including the steps of:

A. forming an insulating structure on an insulating box disposed on said SOI (semiconductor on insulator) substrate, said insulating structure having an exposed top surface, and wherein said insulating structure is surrounded by a semiconductor material on said insulating box, and wherein a thickness of said semiconductor material surrounding said insulating structure is in a range of approximately 300 Å (angstroms) to approximately 500 Å (angstroms), and wherein said insulating structure is comprised of silicon dioxide;

B. implanting a dopant into a predetermined face of a second semiconductor wafer to have a peak concentration at a depth of a predetermined thickness from said predetermined face of said second semiconductor wafer, and wherein said second semiconductor substrate is comprised of silicon, and wherein said dopant is comprised of hydrogen ions, and wherein said predetermined thickness is in a range of approximately 50 Å (angstroms) to approximately 100 Å (angstroms);

C. pressing down said second semiconductor substrate with said predetermined face of said second semiconductor substrate being applied onto said exposed top surface of said insulating structure and onto said semiconductor material surrounding said insulating structure, wherein a downward force is applied on the second semiconductor substrate against said exposed top surface of said insulating structure and against said semiconductor material surrounding said insulating structure;

D. removing said second semiconductor substrate away from said exposed top surface of said insulating structure and away from said semiconductor material surrounding said insulating structure;

wherein said peak concentration of said dopant at said predetermined thickness from said predetermined face of said second semiconductor wafer causes said predetermined thickness of material of said second semiconductor substrate to be deposited onto said exposed top surface of said insulating structure from said second semiconductor substrate being pressed against said exposed top surface of said insulating structure in said step C;

and wherein said thin active device area is formed of said predetermined thickness of material of said second semiconductor substrate being deposited onto said exposed top surface of said insulating structure;

and wherein said predetermined thickness of material of said second semiconductor substrate is deposited onto said semiconductor material surrounding said insulating structure from said second semiconductor substrate being pressed against said semiconductor material surrounding said insulating structure in said step C;

E. forming a field effect transistor in said thin active device area, wherein a drain extension, a source extension, and a channel region under a gate of said field effect transistor is formed in said thin active device area; and F. forming a drain silicide and a source silicide of said field effect transistor with said semiconductor material surrounding said thin active device area and with said predetermined thickness of material of said second semiconductor substrate deposited onto said semiconductor material surrounding said insulating structure, and wherein said drain silicide and said source silicide of said field effect transistor have a thickness in a range of approximately 350 Å (angstroms) to approximately 600 Å (angstroms).

* * * * *